(12) United States Patent
Jaeschke et al.

(10) Patent No.: US 10,176,978 B2
(45) Date of Patent: Jan. 8, 2019

(54) CONTROL OF MAGNETIC SECTOR MASS SPECTROMETER MAGNET

(71) Applicant: Thermo Fisher Scientific (Bremen) GmbH, Bremen (DE)

(72) Inventors: Jürgen Jaeschke, Stuhr-Brinkum (DE); Michael Deerberg, Delmenhorst (DE); Hans-Jürgen Schlüter, Bremen (DE)

(73) Assignee: Thermo Fisher Scientific (Bremen) GmbH, Bremen (DE)

( * ) Notice: Subject to any disclaimer, the term of this patent is extended or adjusted under 35 U.S.C. 154(b) by 40 days.

(21) Appl. No.: 15/532,935

(22) PCT Filed: Dec. 3, 2015

(86) PCT No.: PCT/EP2015/078577
§ 371 (c)(1),
(2) Date: Jun. 2, 2017

(87) PCT Pub. No.: WO2016/091724
PCT Pub. Date: Jun. 16, 2016

(65) Prior Publication Data
US 2018/0269053 A1 Sep. 20, 2018

(30) Foreign Application Priority Data
Dec. 12, 2014 (GB) .................................. 1422195.6

(51) Int. Cl.
*H01J 49/26* (2006.01)
*G21K 5/04* (2006.01)
(Continued)

(52) U.S. Cl.
CPC .......... *H01J 49/30* (2013.01); *H01J 49/0009* (2013.01); *H01J 49/0031* (2013.01); *G01R 33/072* (2013.01); *G01R 33/091* (2013.01)

(58) Field of Classification Search
CPC .... H01J 49/30; H01J 49/0009; H01J 49/0031; G01R 33/072; G01R 33/091
(Continued)

(56) References Cited

U.S. PATENT DOCUMENTS 3,597,679 A 8/1971 Habfast
5,077,470 A * 12/1991 Cody .................... H01J 49/022
250/282
(Continued)

FOREIGN PATENT DOCUMENTS

EP 0475674 A2 3/1992

OTHER PUBLICATIONS

Lake Shore Cryotronics, "Lake Shore Model 475 DSP Gaussmeter User's Manual", Section 1.1.3.: Probe Support, http://www.lakeshore.com/Documents/475_Manual.pdf, XP055249805, May 13, 2014, pp. 13-14.
(Continued)

*Primary Examiner* — Nicole Ippolito
(74) *Attorney, Agent, or Firm* — David A. Schell (57) ABSTRACT

A control system for controlling a magnet of a magnetic sector mass spectrometer comprises a magnetic field sensor for sensing the magnetic field of the magnet and generating an output representative thereof; a set point generator configured to generate an output representative of, or related to, a desired magnetic field of the magnet; and a digital controller configured to receive a variable digital input signal from the output of the magnetic field sensor and a set point digital input signal from the output of the set point generator, and to generate a digital output from which is derived a control signal for controlling a current to the magnet so as to control the magnetic field thereof. The control system is arranged to apply to the digital controller a selected one of
(Continued)

a plurality of different controller settings, in accordance with the desired magnetic field of the magnet.

22 Claims, 6 Drawing Sheets

(51) Int. Cl.
*H01J 49/30* (2006.01)
*H01J 49/00* (2006.01)
*G01R 33/07* (2006.01)
*G01R 33/09* (2006.01)

(58) Field of Classification Search
USPC ...... 250/281, 282, 396 R, 397, 492.1, 492.2, 250/492.3
See application file for complete search history.

(56) References Cited

U.S. PATENT DOCUMENTS

| | | | |
|---|---|---|---|
| 5,650,616 A * | 7/1997 | Iketaki | G01N 23/22 250/282 |
| 2005/0051720 A1 | 3/2005 | Knecht et al. | |
| 2006/0148104 A1 * | 7/2006 | Marini | B82Y 5/00 436/524 |
| 2009/0309520 A1 | 12/2009 | Balakin | |
| 2011/0147578 A1 * | 6/2011 | Schultz | G01N 23/2258 250/282 |
| 2012/0205534 A1 * | 8/2012 | Hunter | H01J 49/0013 250/282 |

OTHER PUBLICATIONS

Malafronte et al., "Inexpensive Magnetic Field Controller", Proceedings of 2005 IEEE Particle Accelerator Conference, Knoxville, Tennessee, pp. 451-453.

Middelhoek et al., "Silicon sensors", Meas. Sci. Technol. 6 (1995), pp. 1641-1658.

Oxley et al., "Magnetic properties of stainless steels at room and cryogenic temperatures", Journal of Magnetism and Magnetic Materials 321 (2009), pp. 2107-2114.

Perry et al., "Reducing the magnet switching time for AMS at PRIMELab", Nuclear Instruments and Methods in Physics Research B, vol. 123 (1997), pp. 178-182.

* cited by examiner

CONTROL OF MAGNETIC SECTOR MASS SPECTROMETER MAGNET

BACKGROUND

Field of the Invention

This invention relates to the control of a magnetic sector mass spectrometer magnet. In particular it relates to circuitry and a method for closed loop control of the magnet.

Background of the Invention

Magnetic sector mass analyzers are a well-known class of mass spectrometer, for high resolution analysis of ions across a relatively wide mass range. Ions are accelerated through a flight tube under the influence of an accelerating voltage $U_0$ where they separate in time of flight. The kinetic energy of ions at the end of the accelerating process, $mv^2/2$, is a result of the energy imparted by the accelerating field, $z \cdot U_0$; hence $$z \cdot U_0 = \frac{m \cdot v^2}{2}$$

As the moving ions enter the magnetic field created by a magnet, charged ions of a particular mass to charge ratio m/z are deflected along a circular path of unique radius $r_m$ in a direction perpendicular to the direction of the applied magnetic field. As will be well known, the force due to the magnetic field (z.v.B, where z is the ionic charge, v is the ion velocity, and B is the magnetic field strength) balances the centripetal force $mv^2/r_m$.

Rearranging for v and substituting into the equation above yields:

$$\frac{m}{z} = \frac{B^2 \cdot r_m^2}{2 \cdot U_0}$$

In other words, ions of a particular mass to charge ratio will follow a curved path of radius $r_m$ for a given magnetic flux density B and when accelerated to a particular potential $U_0$.

In a sector mass analyzer, the relative positions of the ion source, accelerator region, magnet and detector are fixed. Hence ions of a particular species will only arrive at the detector (rather than the walls of the analyzer for example) at a specific B and $U_0$.

For detecting a particular mass, it is necessary to control (ie hold steady) the magnetic field to a high degree of accuracy. Of course, the accelerating potential $U_0$ must also be held constant but this is relatively straightforward; also note from the equation above that the position of ions as they arrive at the detector (related to $r_m$) is proportional to $B^{-1}$ but is less sensitive to changes in $U_0$ as $r_m$ depends on the square root of $U_0$.

Both $U_0$ and B can in principle be varied to scan multiple ion species across the detector. However it is preferable, for a particular experiment, that $U_0$ be held constant whilst B is changed. This is primarily because, in a magnetic sector mass analyzer, the focal point of the ions changes with $U_0$ and it is desirable that the ion beam remain focused on the detector.

It is known in the art to measure the flux density generated by the magnet by an appropriate sensor, and to use this signal to regulate the magnetic field. See for example U.S. Pat. No. 3,597,679. An appropriate sensor is typically either a Hall effect sensor or a Field probe.

Figure 1:
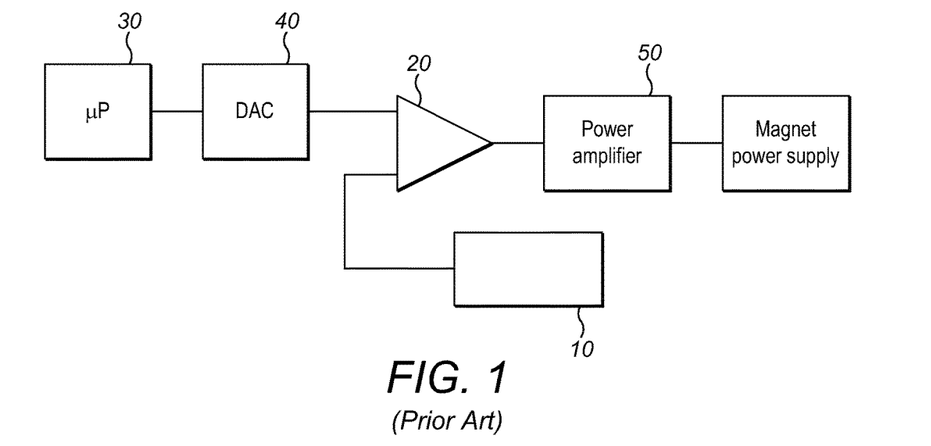
FIG. 1 shows a schematic arrangement of a prior art control arrangement for controlling the magnetic flux density in a magnetic sector mass spectrometer.

A typical set-up is shown in FIG. 1. The flux density within the magnet is measured using a field probe 10 or the like. The analogue signal output from the field probe 10 is amplified and then connected to a first input of an operational amplifier 20. A set value is generated as a digital signal at a microcontroller 30 and is converted to an analogue signal at DAC 40. The output of the DAC 40 is connected to the second input of the operational amplified 20 so that the (analogue) measured flux density can be compared with the analogue set point.

The output of the operational amplifier 20 is amplified in a power amplifier 50 and the power amplifier 50 output is used to control the current supplied to the magnet in the magnetic sector mass spectrometer. The magnetic flux density measured by the field probe 10 can thus be used to control the set value, and, in this manner, an analogue closed loop feedback control is effected. Moreover, proportional-integral-differential (PID) control of the operational amplifier (and in principle the amplification of the measured flux density) is possible.

Although a step resolution of the magnetic flux density achievable in the arrangement of FIG. 1 is limited by the resolution of the DAC 40, nevertheless the stability of the magnetic flux within one DAC step can be much higher, depending, for example, on the operational amplifier 20 and other part of the electronics.

The primary use of magnetic sector mass spectrometry is for the determination of abundances of known elements in samples (in contrast to, for example, Orbitrap® or TOF Mass Spectrometry, which typically seek to identify unknown elements in samples, or to confirm or refute the presence of a particular substance, or, more usually, a group of substances. This is why maximum stability of the magnetic field is desirable: a highly constant magnetic field at a given $U_0$ will ensure that ions of a particular m/z (and only ions of that specific m/z) are properly focused on the detector, and remain so over time. In consequence, magnetic field stability is directly linked to instrument resolution; for ions of two adjacent masses, the ability to discriminate between them (ie to measure one species but not the other) will be a consequence of magnetic field stability. For an instrument resolution of around 20,000, the standard deviation of the magnetic flux density needs to be stable to within 3 ppm over an hour. For an instrument resolution of 50,000, the standard deviation of the magnetic flux density needs to be stable to within 1 ppm over an hour. Even higher resolutions would be desirable.

In addition to the requirement for a highly stable stationary magnetic field, it is also desirable that the magnet of a sector analyzer be capable of jumping between two stable magnetic flux density values, in order to measure the intensity (quantity) of two different ion species. The jump should be as fast as possible, whilst the magnetic flux density within the magnet following the jump must be stable for the reasons explained above. This is especially demanding, as reorientation of the magnetic domains within the magnet material is governed by a relatively slow time constant.

Remanent magnetization within the magnet core may also present a challenge. In particular, the homogeneity of the magnetic flux density may reduce across the magnet, particularly when jumping from a relatively higher to a relatively lower magnetic field. Furthermore, the magnetic flux density at the position of the magnetic field probe may then differ from the magnetic flux density at the position of the ion beam. The magnet jump will take a considerably longer time when the target magnetic flux density is low.

Figure 2A:
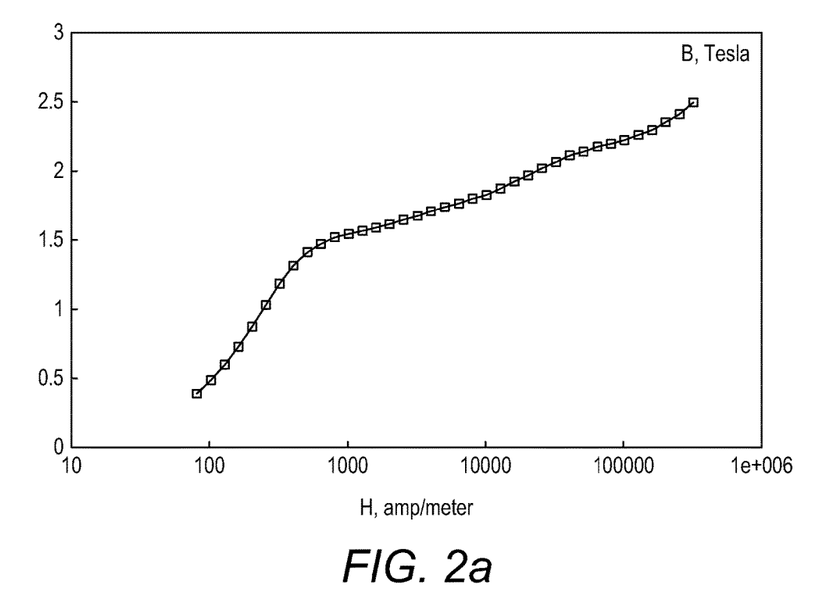
FIG. 2a shows a plot of magnetic flux density, B, versus magnetic field strength, H, for 1006 Steel.
Figure 2B:
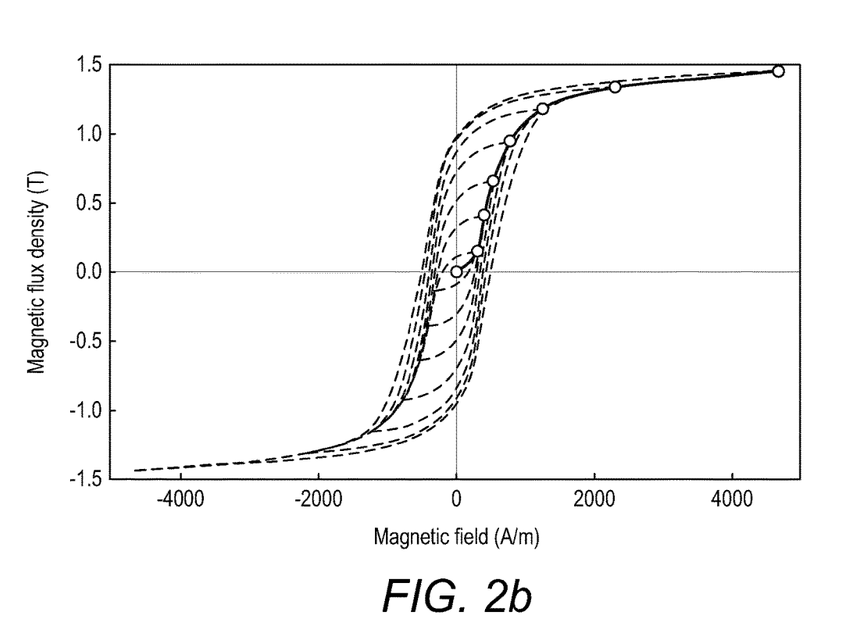
FIG. 2b shows a plot of magnetic flux density, B, versus magnetic field strength, H, for stainless steel

FIG. 2a illustrates a plot of magnetic flux density, B, against magnetic field strength, H, for 1006 Steel (source: Femm 4.2 (finite element magnetic simulation software, David Meeker). From that FIG. the non-linearity of B vs H is very clear. FIG. 2b is derived from Paul Oxley et al, Journal of Magnetism and Magnetic Materials 321 (2009)$_{2107}$-2114 and illustrates hysteresis effects as the magnetic field jumps. FIG. 2b shows how the H field (Magnetic field strength, measured in A/m, and proportional to magnet current)) necessary to reach a certain flux density value depends on the history (jump size) and, moreover, just how non-linear the behavior is.

The result of this is that a single set of PID parameters is generally inappropriate to cover all possible jump sizes and flux densities. In particular, the PID parameters determined for a jump between a first pair of magnetic field strengths may not be appropriate—or at least, not optimal—for a jump between a second, different pair of magnetic field strengths. Jumping between different magnetic flux densities means that different time constants would have to be considered, e.g. the time constant of the power stage, the time constant of the ordering of the magnetic domains, and the time constant for heating up the magnets.

Furthermore, even once the magnetic field is nominally stationary (ie is not in the process of jumping from one value to another) the PID parameters are fixed for all values of B and $U_0$. In practice this means that they are at best a compromise, and for certain combinations of target flux densities and jump sizes, may not be very appropriate at all. Even for a given nominal magnetic flux density, optimal PID parameters will depend upon device specific conditions such as the particular location of the field sensor within the magnet gap and so forth.

The electronic circuit of FIG. 1 also itself introduces potential sources of both random and systematic error to the magnetic flux density in the magnet gap. For example, the output of the magnetic field probe always contains some noise. Smoothing is typically done by applying RC elements. It is challenging to optimize the circuitry in order to smooth away the noise, but at the same time not sacrifice time information. Also there are a number of possible sources for drift effects, e.g. due to temperature changes, especially in the field sensor 10, the operational amplifier 20 and the DAC 40 of FIG. 1. Addressing these effects requires elaborate and costly electronic designs, e.g. temperature stabilization and/or calibration.

Typically, the magnetic flux density B in a magnetic sector mass spectrometer will be variable between a few tens of mT and a few hundreds of mT, up to about 1 T. In a currently preferred instrument, for example, the flux density inside the magnet gap is variable between 200 mT and 750 mT. The flux density in the iron core of the magnets is typically higher by a factor of up to 2, depending upon magnet design and geometry. Fast jumps can occur over the full mass range.

A. A. Malafronte, M. N. Martins, Proceedings of 2005 Particle Accelerator Conference, Knoxville, Tenn., page 2833ff describe an arrangement for controlling the magnetic field in a microtron. The output of a Hall sensor is converted to a digital signal using a 16 bit ADC. A digital set point for the control loop is generated and a microcontroller compares the digital set point with the digitized Hall sensor output. A digital control signal is then generated as an output from the microcontroller as a result of the comparison. That digital output is supplied to a 16 bit DAC which provides an output that is amplified in an analogue driver. The output of the driver in turn controls the current to the magnet power supply.

The Malafronte arrangement is aimed at reducing cost. Magnetic field stability and jump speed between different magnetic flux densities are not critical to the considerations in the microtron controller described; flux stability of 30 ppm is noted, which is an order of magnitude or more poorer than is needed for a high resolution (20,000 or higher) magnetic sector mass spectrometer.

Against this background, the present invention seeks to provide an improved arrangement and method for control of the magnetic field in a magnetic sector mass analyzer.

BRIEF SUMMARY OF THE INVENTION

According to a first aspect of the present invention, there is provided a control system for controlling a magnet of a magnetic sector mass spectrometer in accordance with claim 1.

In its broadest sense, this aspect of the invention thus provides a digital controller for a magnetic sector mass spectrometer, to which different controller settings are applied depending upon the specific parameters of the mass spectrometer.

For a given configuration of a magnetic sector mass spectrometer, ions will move through it in accordance with a set of potentially variable parameters: for example, an accelerating potential of the mass spectrometer, a magnetic field generated by the magnet, the mass to charge ratio of the ions, the relative positions of an ion source and a detector, and so forth. In order for ions of a particular mass to charge ratio to pass through the mass spectrometer and arrive at the detector, specific mass spectrometer parameters need to be set. In accordance with the first aspect of the invention, appropriate settings for the controller—for example, the constants of a transfer function of the control loop—can be selected in accordance with the particular mass spectrometer parameters. In one preferred embodiment, the control system may employ a look up table in which predetermined or calibrated controller settings have been stored. Then, by reference to that look up table, a particular controller setting can be selected in accordance with the specific mass spectrometer parameters that are to be employed in analysis of a sample. In particular, the look up table may contain multiple difference controller settings determined to be particularly suitable for specific magnetic flux densities, acceleration voltages, mass to charge ratios, etc.

As an alternative to a look up table, the control system may instead store a functional relationship from which control settings may be calculated, depending upon the mass spectrometer parameters. For example, a functional relationship between the magnetic flux density in the magnet and the controller settings may be determined empirically or heuristically from prior experimentation/calibration. Then, during subsequent analysis of sample ions, the appropriate controller settings can be determined from the stored functional relationship once the appropriate magnetic flux density and so forth has been identified.

In a preferred embodiment of the invention, the magnetic field sensor is a magnetoresistive single crystal sensor or a Hall sensor derived from a single crystal. The (analogue) output of such a sensor is, preferably, converted to a digital signal at or immediately adjacent to the sensor using an ADC. The digital part of the control system is insensitive to temperature fluctuations. By locating the ADC at or adjacent to the field sensor, temperature control requirements are localized.

In order to control the temperature at the field sensor, in a simple embodiment a temperature sensor is employed to provide a correction signal to the ADC. In a more complex preferred arrangement, temperature control of the field sensor may be achieved by the use of a temperature sensor, a temperature controller and a heater/cooler, the temperature sensor providing a measured input to the temperature controller for comparison against a set point temperature input, the temperature controller generating a control signal output to the heater/cooler so as to reduce an error between the set point and measured temperature inputs.

The field sensor is in preference enclosed within a housing to assist with temperature regulation.

The control system may further comprise a digital filter arranged to filter the ADC output, such as an infinite impulse response filter. Particularly preferred is a Chebyshev type I filter.

The output of the digital controller may be converted into an analogue signal that is used to control a current to the magnet. Optionally, the digital controller output may be converted to an analogue signal using a digital to analogue converter (DAC) arrangement that may, for example, include first and second DACs. The output of the DAC arrangement may be amplified using an operational amplifier the output of which drives a power amplifier.

Desirably, the control system may further comprise an analogue feedback circuit connected between a coil of the magnet and the DAC arrangement. The feedback circuit may be used to provide an analogue feedback loop with a switchable frequency response. The filtered output may be combined with the output of the DAC arrangement at the operational amplifier that drives the power stage. This allows for correcting fluctuations at shorter timescales than the cycle time of the digital loop.

The invention also extends to a magnetic sector mass spectrometer comprising an ion source arranged to generate a beam of ions having a mass to charge ratio m/z; an ion accelerator arranged to accelerate ions to a potential $U_o$; a magnet under the control of the control system set out above, arranged to divert the accelerated ions along a circular path in accordance with m/z, $U_o$ and the magnetic flux density within the magnet; and an ion detector downstream of the magnet for receiving and detecting ions from the magnet.

Preferred embodiments of the invention provide various techniques for establishing the plurality of controller settings. For example, the mass spectrometer parameters can be adjusted so as to align the edge of a mass spectral peak with the detector. The edge of a peak is typically very sharp (that is, the intensity of the peak rises very rapidly with small changes in the magnetic flux density). Thus detecting the change in ion intensity at the detector can provide an accurate measurement of changes in magnetic flux density. By aligning the edge of the mass spectral peak with the detector and then perturbing the parameters of the mass spectrometer (for example, by introducing a perturbation into the current supplied to the magnet, so as in turn to perturb the magnetic flux density, or perturbing the accelerating electric field), controller settings for that set of mass spectrometer parameters (specifically, for that magnetic flux density) can be determined. For example, if the controller uses Proportional-Integral-Differential (PID) control, perturbing the magnetic field around the edge of the mass peak can allow the transfer function constants (one or more of the proportional, integral or differential constants). The thus determined controller settings can be stored for future use when analyzing ions using the same or similar mass spectrometer parameters.

This technique can be employed both to ascertain suitable controller settings for a stationary magnetic field, and also for determining suitable controller settings to optimize a transition between two magnetic fields. In a particularly preferred embodiment, the controller system may employ a first controller setting for a transition between two magnetic fields, to optimize the speed and accuracy of that transition—for example, to minimize overshoot—and then may apply a second, different controller setting once the system has reached the goal magnetic field, the second controller setting being optimized to maintain the magnetic flux density as constant as possible there.

The invention also extends to a method of controlling a magnetic field generated by a magnet in a magnetic sector mass spectrometer, in accordance with claim 23.

In further aspects of the present invention, methods are provided for determining controller settings for a controller, the controller being arranged to control a magnetic field generated by a magnet in a magnetic sector mass spectrometer. The methods are defined in claims 50 and 51.

The invention also extends to a method of controlling a magnetic field generated by a magnet in a magnetic sector mass spectrometer comprising generating ions of a plurality of ion species; accelerating the generated ions with an electrical potential $U_0$; directing the accelerated ions into the magnet, the magnet being configured to generate a magnet field of flux density B so as to cause ions entering it to be deflected along a curved path; and detecting ions exiting the magnet at an ion detection arrangement; wherein ions of a first sacrificial ion species have a mass to charge ratio $(m/z)_1$ and follow a first curved path within the magnet whilst ions of a second, analyte ion species different to the sacrificial species have a mass to charge ratio $(m/z)_2$ and follow a second curved path, different to the first curved path, within the magnet; and further wherein the ion detection arrangement has a plurality of spatially separated detectors; the method further comprising: adjusting one or more of the flux density B, the acceleration potential $U_0$ and/or the position of a detector or detectors in the ion detection arrangement, so that ions of the sacrificial species are directed toward a first detector in order that the edge of a mass peak representative of those ions of the sacrificial species is aligned with the first detector, whilst ions of the analyte ion species are directed toward a second detector, spatially separated from the first detector, so that a mass peak representative of those analyte ions is generally aligned with the second detector away from the mass peak edges; and controlling the magnetic flux density B by monitoring changes in the detector intensity at the peak edge of the sacrificial mass, so as to maintain the alignment of the analyte ions with the said second detector.

The edge of a mass peak in a magnetic sector mass spectrometer is typically sharp. Advantage may be taken of this by directing the peak edge of a sacrificial mass (that is, an ion species that is not of analytical interest) at a first detector, whilst ions of a species of analytical interest may be directed at a second detector. Small fluctuations in the magnetic flux density in the magnet will result in large changes in the intensity of ions at the first detector because the peak edge is directed to that first detector. Peak intensity changes can thus be used to provide a feedback signal representative of flux density changes to control the magnetic flux. This in turn allows control of the analyte ions so that they remain directed toward the second detector but away from the peak edges, ie (for example) at or toward the peak centre.

In still a further aspect of the present invention, a magnetic sector mass spectrometer is provided, comprising: an ion source arranged to generate a beam of ions containing one or more ion species each having a mass to charge ratio $(m/z)_i$; an ion accelerator arranged to accelerate the ions in the ion beam to a potential $U_o$; a magnet arranged to divert the accelerated ions along a circular path in accordance with $(m/z)_i$, $U_o$ and the magnetic flux density B within the magnet; a control system for controlling the magnet, the control system including a set point generator configured to generate an output representative of, or related to, a desired magnetic field of the magnet; a magnetic field sensor for generating a signal representative of the flux density B in the magnet; and a digital controller configured to receive a variable digital input signal from the output of the magnetic field sensor and a set point digital input signal from the output of the set point generator, and to generate a digital output from which is derived a control signal for controlling a current to the magnet so as to control, in turn, the magnetic field thereof; and an ion detection arrangement downstream of the magnet for receiving and detecting ions from the magnet.

Advantages of the invention may include one or more of the following:

Lower costs

Better temperature stability as only the magnetic field sensor has to be taken into account Better operation security Faster in regulation Faster magnet jump between two magnetic flux densities; also different controller settings can be identified for the same start and finish magnetic flux densities, to achieve different behavior models. For example, one controller setting can allow for overshoot, in order to provide the fastest change between the two magnetic flux densities. Non-periodic behavior may instead be mandated, if overshooting is disadvantageous, e.g. to protect the SEMs in the detector;

Variable PID or other controller settings are possible, depending on magnetic flux density value, Magnetic jump size, detector position and/or instrument age.

Combination of the static and dynamic controller settings leads to a very fast and stable magnetic flux density value When using a peak edge and a sacrificial mass, even better stability of the magnetic flux density can be achieved;

The signal of the magnetic field sensor 140 can be digitally filtered, providing a better compromise between smoothing and time resolution;

As the integral of the ion beam is used for the calibration, it is not necessary that the position of the probe be adjusted as accurately. Indeed, although it is not preferred to locate the magnetic field sensor within a stray field region of the magnet, even then the magnetic field sensor position could be calibrated out.

Quality assurance: the derivation of the controller settings can be repeated regularly.

The same magnet current controller and magnetic field sensor can be used for a large number of different instruments without any hardware modification; only the controller settings have to be changed when using on a different instrument, thus saving on cost and logistics;

The quality of the magnet can be lower, e.g. the linearity of the magnetic curve and the hysteresis, as this can be calibrated out;

The controller setting determination process as suggested would calibrate the magnetic field sensor in such a way that the complete system (field sensor, electronics, magnet (more specifically: an integral of the magnetic flux density at the area covered by the ion beam) is taken into account.

BRIEF DESCRIPTION OF THE DRAWINGS

The invention may be put into practice in a number of ways, and some preferred embodiments will now be described by way of example only, and with reference to the accompanying drawings in which.

DETAILED DESCRIPTION OF THE EMBODIMENTS

Figure 3:
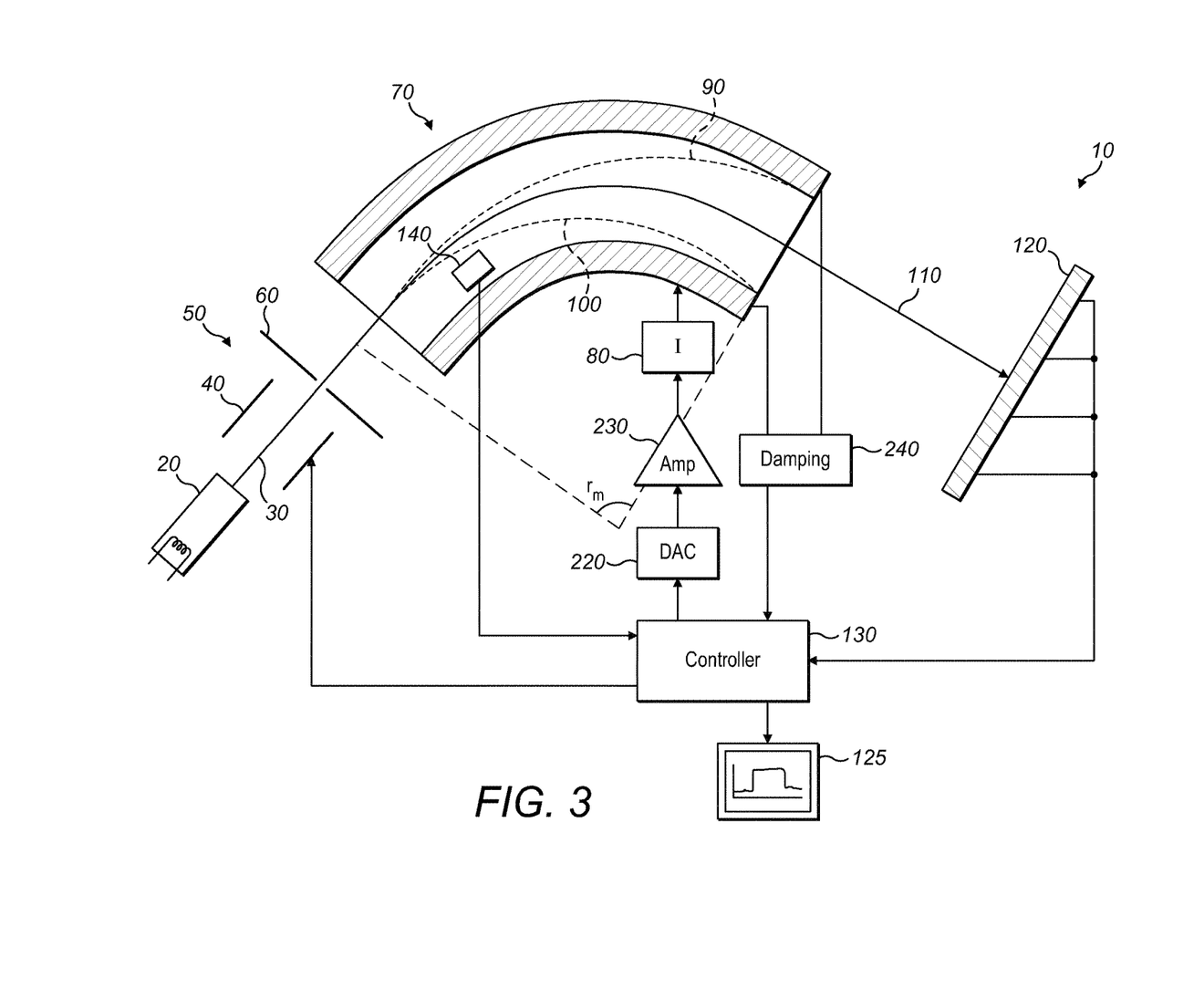
FIG. 3 shows a schematic arrangement of a magnetic sector mass spectrometer having a control system embodying the present invention.

Referring first to FIG. 3, a schematic arrangement of a magnetic sector mass spectrometer 10 is shown. The magnetic sector mass spectrometer has an ion source 20 for generating a beam of ions 30. The ions in the ion beam 30 are accelerated by electrostatic plates 40 forming accelerating ion optics, indicated generally in FIG. 3 by reference numeral 50. The ion beam 30 passes through a slit 60 and into a magnet 70. The magnet 70 is an electromagnet driven by a current source 80. A magnetic field is thus formed within the magnet bore.

As explained in the Background section above, and as will be familiar to those skilled in the art, ions entering the magnet 70 will follow a circular path having a radius $r_m$ defined as $r_m = B^{-1} (2 \cdot U_0 \cdot (m/z))^{1/2}$, where $U_0$ is the accelerating potential applied to the ions in the accelerating ion optics 50, B is the magnetic flux density in the magnet 70, and (m/z) is the mass to charge ratio of ions of a particular species.

The consequence of this is that, for a given accelerating potential and magnetic field, different ion species in the ion beam 30 will follow different paths (that is, curved paths of different radii), depending upon their m/z. Relatively lighter ions will follow a more tightly curved path indicated by dotted line 100 whilst relatively heavier ions will follow a less tightly curved path indicated by dotted line 90. Neither will exit the magnet as a consequence. Ions of a particular m/z will however have a radius of curvature that results in ions of that species in the ion beam 30 exiting the magnet along path 110. These ions then strike a detector 120 which may, for example, contain one or more Faraday cups and/or secondary electron multipliers (SEMs). In the schematic embodiment of FIG. 3, a single detector 120 is shown for simplicity. The detector output may be stored, exported to a screen 125, and/or, as will be explained below, in particularly preferred embodiments of the invention, used to tune the settings of a controller 130.

The mass spectrometer 10 is under the control of a control system. Its purpose and function will be described in detail below. In brief, however, the control system provides a closed loop feedback control for the magnet 70. This is achieved by monitoring/measuring the magnetic flux density within the magnet 70. To do this, a magnetic field sensor 140 is positioned within the bore of the magnet 70. The preferred configuration and constitution of the magnetic field sensor 140 is set out in further detail in connection with FIG. 5 below.

The magnetic field sensor 140 provides a variable input to a controller 130. The variable input to the controller 130 is representative of the magnetic flux density at the sensor location within the magnet 70. A set point input to the controller is provided, either from an external set point generator (not shown in FIG. 3) or pre-programmed within the hardware or firmware of the controller 130 itself. The controller 130 compares the variable input from the magnetic field sensor 140 with the set point (target magnetic flux density) and then generates a digital controller output that is converted to an analogue signal at DAC stage 220, amplified with amplifier 230, and fed to the magnet current source 80. Control of the current supplied to the magnet windings thus in turn controls the magnetic flux density within the magnet 70.

As with any feedback loop, the arrangement of FIG. 3 has a transfer function. In a preferred embodiment, the controller 130 uses Proportional-Integral-Differential (PID) control, and the controller settings (for example, the proportional gain, the integral time constant and/or the differential time constant) are selected and applied in accordance with the parameters of the mass spectrometer 10, such as, particularly, the chosen magnetic flux density B within the magnet 70 for a particular ion species, a jump between two magnetic flux densities, and so forth.

As will also be seen in FIG. 3, a signal is also tapped off the magnet coil windings and fed back to the controller 130 via an analogue damping section 240, to provide a damping effect upon the driver signal for the current source 80. This will be explained in further detail in connection with FIG. 4 below.

In the following description, it is to be understood that the controller 130 is primarily designed to control the magnetic field in the magnet 70, that is, to permit rapid, accurate adjustments between different magnetic flux densities (so that multiple ion species can be examined separately using the same or a similar location for the detector 120), and also to hold the magnetic flux density in the magnet 70 extremely steady and accurate whilst measurements of ions of a particular species are taken. Nevertheless it is self-evident from the equation above that the acceleration potential $U_0$ applied to the electrostatic plates 40 of the accelerating ion optics 50 must also be known and accurately set. $U_0$ may also vary between experimental analyses, so as to allow a wide range of ion species to be analyzed. However it is not preferred to vary $U_0$ whilst carrying out analysis, since variations in $U_0$ can alter the focusing of the ions in the ion beam 30 at the plane of the detector 120. Thus in the following description, unless otherwise discussed, the accelerating potential $U_0$ can be treated as fixed during a particular controller calibration/tuning or subsequent ion analysis experiment.

Having provided an overview of the feedback system and its position and function within the magnetic sector mass spectrometer 10, a particular preferred embodiment of the controller 130 and associated components will now be described. Methods for tuning/calibrating the settings for the controller 130 will then be described in a separate section.

Preferred Configuration of the Controller 130

Figure 4:
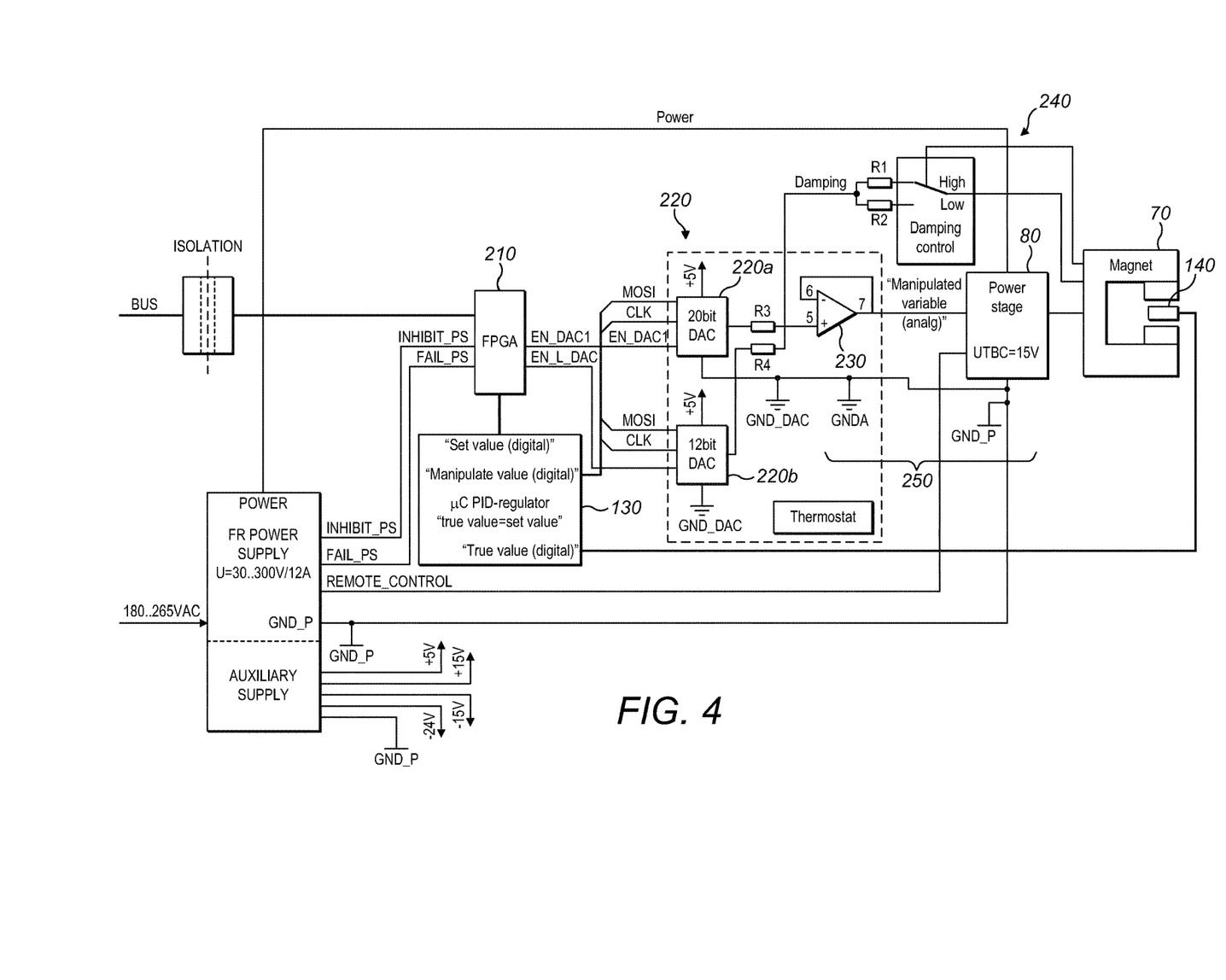
FIG. 4 shows a circuit diagram of a preferred embodiment of the control system of FIG. 3.

A circuit diagram illustrating a particularly preferred arrangement of the control system of FIG. 3 is shown in FIG. 4. In FIG. 4, components common to FIG. 3 are labelled with like reference numbers.

The controller 130 of FIGS. 3 and 4 is constituted by a microcontroller to which a set point (target magnetic flux density) is supplied from a Field Programmable Gate Array (FPGA) 210. The magnetic field sensor 140 also supplies a variable input to the controller 130 as explained above in connection with FIG. 3.

The controller 130 is digital. The set point generated by the FPGA 210 is a first digital input to the digital controller 130, and the second input to the digital controller, from the magnetic field sensor, is also digital. The magnetic field sensor is in preference a magnetorestive or Hall sensor which generates an analogue output. This is converted to a digital signal using an ADC (not shown in FIG. 4). In preference, the ADC is located immediately adjacent the magnetic field sensor (or even upon/forms a part of the sensor) in order to minimize the effect of temperature variations upon the magnetic field stability. This will be explained further in connection with FIG. 6 below.

The controller 130 provides a PID response to the difference between the digital set point input and the digital (digitized) variable input from the magnetic field sensor. The PID settings for the controller 130 are, in an important feature of the arrangement, not fixed. Instead, a plurality of different PID settings is employed, with the specific PID setting employed at a given time being dependent upon parameters of the magnetic sector mass spectrometer 10. For example, the PID settings applied to the controller 130 may be related to one or more of the present magnetic flux density in the magnet 70, the new end set point of the magnetic flux density when a different ion species is to be detected, the magnitude of the jump between the two differing flux densities, and so forth. The specific PID settings for a particular set of mass spectrometer parameters may be obtained through calibration/tuning at a particular set of mass spectrometer parameters, for example in a manner to be described below, and may be stored as a matrix of values in a memory (not shown in FIG. 4), which may form a part of the controller 130, or may be physically discrete from the controller 130 instead. Moreover, although a matrix of value for the PID parameters of the controller 130 can be stored in the form of a lookup table, in other arrangements, a functional relationship can be derived, for example deterministically, so that for any set of mass spectrometer parameters, PID settings can be obtained via that functional relationship.

The output of the controller 130 is a digital control signal for controlling the magnet current, which is derived from the difference between the set point and measured inputs with the appropriate PID parameters applied. That digital output is converted into an analogue signal by a digital to analogue conversion (DAC) stage 220. The analogue output of the DAC stage 220 is received by an amplification module shown generally at 250 and formed of an operational amplifier 230 that in turn provides an analogue output to a power stage which forms a part of the magnet current source 80.

An analogue damping section 240 is also provided as a feedback between the magnet coils, the DAC stage 220 and the non-inverting input of the operational amplifier 230. The analogue damping section includes an additional field coil at the magnet 70 providing a feedback to the operational amplifier 230 for setting the magnet current in the power stage of the magnet current source 80. The analogue damping section 240 also includes switchable high or low damping; this allows for a faster control of transients, whereas the digital control with longer cycle times (<=5 ms) eliminates drift.

In order to achieve maximum stability of the magnetic flux density experienced by ions as they traverse the magnet 70, it is desirable that the resolution of the analogue output of the DAC stage 220 is very high, so that the current to the magnet coils is in turn very accurately controlled. One preferred way of implementing this desideratum is to combine two single DACs to form the DAC stage 220. As may be seen in FIG. 4, the DAC stage 220 is formed of a first, 20 bit DAC 220a, along with a second, 12 bit DAC 220b. The analogue output of each DAC 220a, 220b is combined along with the fed back analogue damping signal from the analogue damping section 240 to form the non-inverting input to the operational amplifier 230.

As an alternative to the use of two DACs 220a, 220b, the DAC stage 220 could instead achieve the desired degree of resolution by using a very fast switching between two values, if the switching time is much faster than the time constant of the power stage in the magnet current source 80.

Although in FIG. 4, the DAC stage 220 is shown separate from the controller 130 and the operational amplifier/current source 80, it will of course be understood that the DAC stage 220 can form a part of the controller 130 or, alternatively, a part of the amplification stage.

The approach to magnetic flux density control illustrated by the arrangement of FIGS. 3 and 4, wherein the controller 130 is digital and so are the inputs to it along with the control signal output, means that only a small part of the system control takes place in the analogue domain, where temperature sensitivity may be an issue. In particular in the arrangement of FIG. 4, the only potential sources of temperature drift are in the (analogue) amplification module 250 and at the magnetic field sensor 140. As to the amplification module, temperature fluctuations that might influence the magnet current are measured indirectly by the magnetic field sensor, and are thus fed back and controlled.

The other temperature sensitive part of the control system is the magnetic field sensor 140 (which produces an analogue signal output) and the ADC (not shown in FIG. 4) that converts the analogue magnetic flux density value to a digital signal. As explained above, in preference, the ADC forms a part of the field probe so that the location of any potentially problematic temperature variations is strictly confined. Although digital magnetic field sensors are available, they are unable to provide the necessary degree of digital resolution and, moreover, are unsuitable for the magnetic flux densities contemplated in the mass spectrometer FIG. 3.

Figure 5:
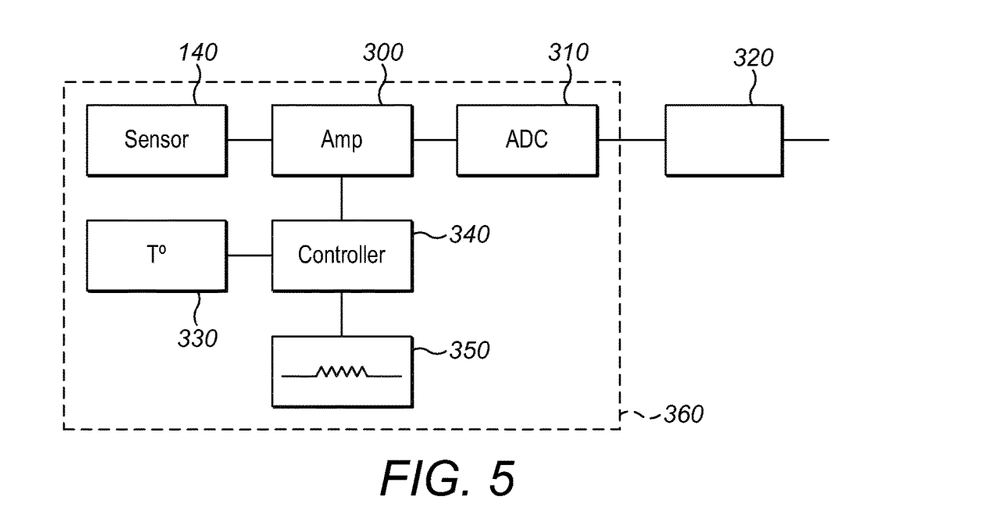
FIG. 5 shows, schematically, a field sensor arrangement suitable for use with the control system of FIGS. 3 and 4.

FIG. 5 shows, in schematic block form, an arrangement for the magnetic field sensor 140 that seeks to address temperature instability at that magnetic field sensor 140.

In the arrangement of FIG. 5, the analogue output of the magnetic field sensor 140 is amplified by sensor amplifier 300 and then converted from an analogue to a digital signal with ADC 310. The digital output of the ADC 310 is filtered at filter 320 and the filter digital output provides the variable digital input signal to the controller 130.

It is desirable to carry out filtering of the magnetic field sensor output after it has been converted into a digital signal by the ADC 310. Digital filtering provides, when employed correctly, a better combination of smoothing and time resolution than may be achieved using resistor/capacitor (RC) type analogue filters.

A particularly preferred arrangement of filter 320 is an infinite impulse response filter, because that requires fewer data points to filter, compared with FIR filters. A particularly preferred implementation may be a Chebyshev type I filter, as such a filter is very sharp and has no ripple in the stop band. A sharp filter is desirable because the time resolution is maintained to a high degree.

As an alternative to the foregoing, an elliptic filter might be employed instead.

The magnetic field sensor 140 may be Hall sensor, a magnetoresistive sensor, an AMR sensor, a GMR sensor, a CMR sensor or a TMR sensor, for example. Particularly preferred is a magneto-resistive sensor in the form of field plates, which is a magnetoresistive sensor cut from a single crystal. Such field plates have a high dynamic range compared to Hall sensors. Also, Hall sensors tend to suffer from the problem of "popcorn" noise and thermal load due to the perpendicular Hall current. The result of a relatively flat characteristic curve is that relatively high Hall currents are in turn needed. On the other hand, single crystal Hall effect sensors may provide an acceptable improvement over traditional Hall sensors.

Returning to FIG. 5, temperature control of the magnetic field sensor 140, the sensor amplifier 300 and ADC 310 is achieved by the use of a temperature sensor 330. The output signal of the temperature sensor may be employed, in a simpler arrangement, directly to control the ADC 310: in particular the input of the temperature sensor 330 is employed by the ADC 310 to correct the analogue magnetic field sensor signal using a known signal/temperature relation.

The preferred manner of temperature control, however, is as shown in FIG. 5. A temperature controller 340 receives the signal from the temperature sensor 330 as a first, variable input. A set point input is also supplied to the temperature controller 340. The temperature controller 340 produces a control output signal that is used to control a heater 350 so that a closed loop thermal control is achieved.

In addition to, or instead of, a heater 350, a cooler such as a Peltier cooler may be employed.

It is desirable, in order further to optimize temperature control, that each of the temperature sensitive components in FIG. 5 (all of the components save for filter 320) be contained within a closed housing (shown as dotted line 360), with thermal insulation inside.

Figure 6:
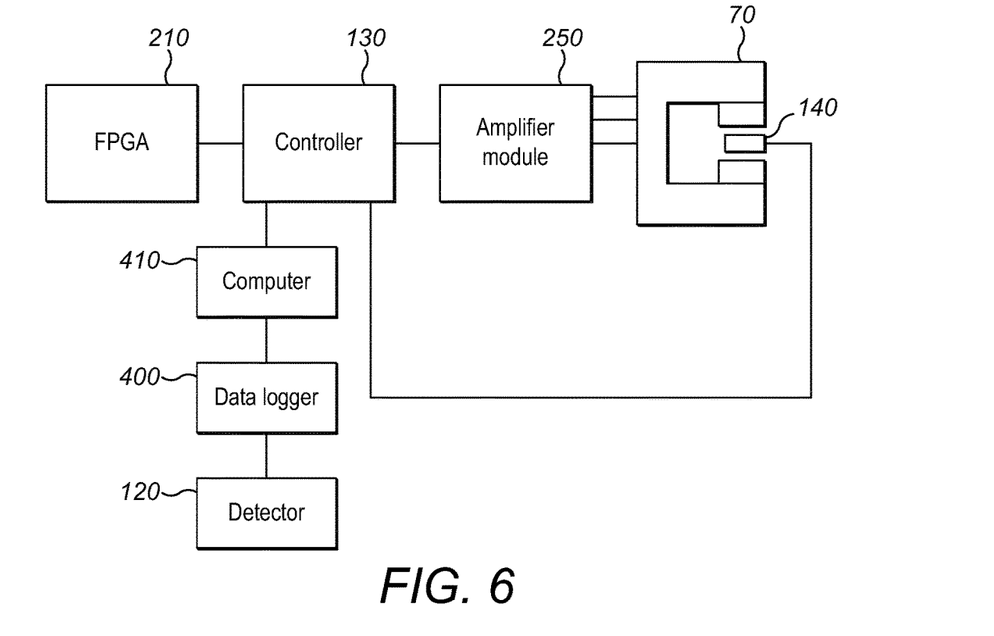
FIG. 6 shows, in schematic block diagram format, an alternative arrangement of control system to that shown in FIG. 4.

Turning now to FIG. 6, an alternative embodiment of a control system is shown in schematic block form. Components common to FIGS. 3, 4 and 6 are labelled with like reference numbers. Furthermore, for the avoidance of repetition, those parts of the control system common to FIGS. 3, 4 and 6 will also not be described again in detail.

In FIG. 6, a digital set point value is generated by the FPGA 210. This provides a first, set point digital input to the controller 130. The magnetic field sensor 140 provides a digital, variable input signal to the controller 130. The output of the digital controller 130, as previously, is converted to an analogue signal that is then amplified in the amplifier module 250 for generation of a demand current for the coils of the magnet 70.

In the arrangement of FIG. 6, however, a further input to the controller 130 is provided from the detector 120 (see also FIG. 3). The detector output is either from a Faraday cup or from an SEM. A data logger 400 processes the output of the ion detector 120. That processed output may either be used directly to provide a further control to the controller 130, or may be pre-processed using a computer or other microprocessor 410. The purpose of using the output of the ion detector 120 as a further input to the controller 130 will be explained in the following section, which concerns the calibration/tuning of the controller 130.

Calibration/Tuning of the Settings of the Control System

Techniques for calibrating or tuning the controller settings for the control system shown in FIGS. 3, 4 and 6 will now be described. By calibrating or tuning is meant the process of determining optimal constants for the control system at a variety of different magnetic flux densities. In the embodiments of FIGS. 3, 4 and 6, the controller 130 employs PID control, and the following techniques result in the derivation of the proportional gain and the integral and differential time constants for different flux densities and also when attempting to transition rapidly between two different magnetic flux densities.

Figure 7:
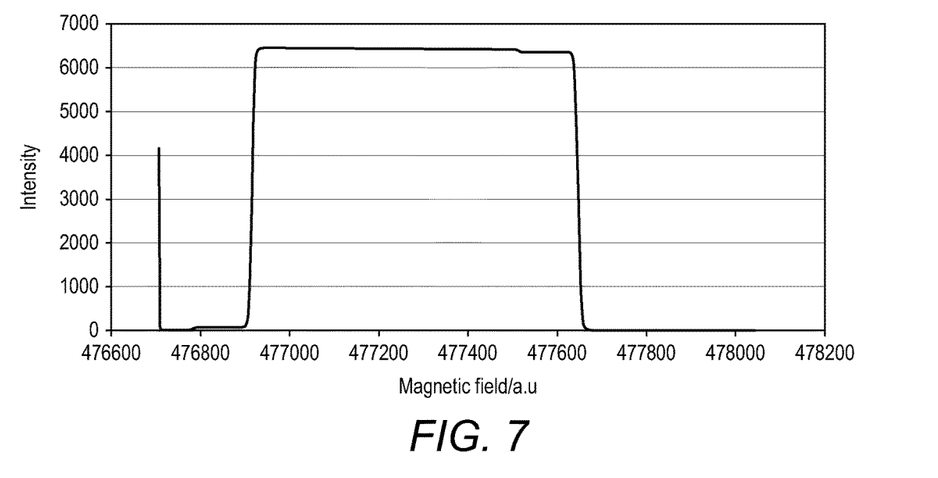
FIG. 7 shows a mass spectral peak as a plot of detector signal intensity vs magnetic flux density for ions of a particular mass to charge ratio.

The calibration techniques all rely upon the sharpness of the edge of a mass spectral peak in a typical magnetic spectrum. A typical such peak is shown in FIG. 7, which is a plot of intensity at the ion detector 120 (arbitrary units) as a function of magnetic flux density for a magnetic sector mass spectrometer having an instrument resolution of 21500.

At both peak edges (leading and trailing edges), the slope of the plot is very high; this means a very small variation in the magnetic flux density value results in a marked effect on the measured intensity. Therefore, measuring the intensity at the peak edge provides an extremely precise way to measure any changes in the magnetic flux density. By determining the slope of the peak at the peak edge, the intensity of the peak can be converted into a magnetic flux density value.

Assuming a linear behaviour between 5% and 95% of the peak height, and for a resolving power of 21500 (the resolving power for the peak in FIG. 7), a change in the magnetic flux density of 1 ppm would result in a change in the measured intensity of 5% of the maximum value of the peak, and 10% of the value at half the peak height.

This technique provides further advantages. Simply measuring the magnetic flux density using the magnetic field sensor 140 provides a useful "snapshot" of the flux density, but is limited to a measurement only of the flux density in the immediate vicinity of the magnetic field sensor 140. By measuring the magnetic flux density using the peak edge, by contrast, an integral over the area of the magnet covered by the ion beam 30 is measured. This may be particularly advantageous when jumping between first and second flux densities, because the slower processes, e.g. due to the reorganisation of the magnetic domains, and the remanent magnetisation in the magnet core, are dependent on the position inside the magnet gap. This is especially important for small magnetic field values.

For optimal system control, it is desirable to obtain controller settings both for static and dynamic magnetic fields. Mass peak edges can be used to obtain both.

Determining the Controller Settings at a Static Magnetic Flux Density.

The first task is to align the peak edge with the detector 120. The magnetic flux density B and the acceleration potential $U_0$ are adjusted so that ions of a particular mass to charge ratio are directed towards the detector 120. Once the edge of the peak has been located by adjusting the parameters of the mass spectrometer, a perturbation is applied to the mass spectrometer parameters to introduce slight oscillations within the control system. From the oscillation frequency the time constant of the control loop is determined and, for a PID control algorithm, the I and D settings can be determined. There are many ways of determining the control settings heuristically or otherwise: Ziegler Nichols, Chien, Hrones and Reswick, and others, each of which will be well known to those skilled in the art of closed loop control. Also the setting for P can be varied until the oscillations are no longer visible in the intensity.

This technique permits the derivation of optimized settings for the controller for the particular magnetic flux density employed in the initial calibration experiment defined above. In particular, the derived settings can be stored for use in any subsequent analysis, in which the magnetic flux density is the same or similar to that at which the settings were derived.

By repeating the analysis at different values of magnetic flux density, an array or matrix of controller settings can be generated, each controller setting being associated with a respective flux density. The matrix can be stored for subsequent use as a look up table or can be used to derive or calculate a functional relationship between B and the controller settings (eg between B and PID).

As explained previously, the equation of motion governing ion movement in a magnetic sector mass spectrometer contains four parameters that can in principle be changed. Of these, however, the radius of the curved path of the ions is essentially fixed in that only ions travelling along a specific path defined by the radius $r_m$ will arrive at the detector 120. This means that, in order to obtain the controller settings for multiple values of B, either the accelerating potential $U_0$ or the mass to charge ratio of the ions must be changed. In one preferred embodiment, the accelerating voltage is changed. Because, for a given mass, the magnetic flux density is proportional to the square root of the voltage, modifying the accelerating voltage by a factor of 4 is equivalent to a factor of 2 variation in the magnetic flux density.

In order to extend the determined controller settings across a wider range of magnetic fields (ie beyond what can be ascertained simply by modifying $U_0$), different mass to charge ratio ions must be employed. For example, if $CO_2$ is introduced into the ion source 20, there are fragment masses of considerable intensity at the masses 12, 22, 28, 44. Therefore, with one gas, and different accelerating voltage values $U_0$, $U_1$, $U_2$ ..., the controller settings for the whole mass range up to mass 44 can be ascertained.

Determining the Controller Settings for a Changing Flux Density.

If the magnet field is modified step wise, and if the final magnetic flux density value is a value where the mass peak is at an raising or falling edge as shown in FIG. 7, the reaction of the system to a stepwise jump can also be determined and optimized. Optimal controller parameters can in particular be ascertained, for example, in accordance with the second rule by Ziegler Nichols, or by other algorithms. Optimising the controller settings for a jump between two magnetic flux densities allows the speed at which the jump can take place to be optimized in turn. Also, when considering the derivation of controller settings for a dynamic magnetic field, the effect that the magnetic flux density—and the time behavior of it—is dependent on the position, and especially the difference between the integral that the ion beam 30 covers and the position of the magnetic field sensor 140, is also calibrated out.

Depending on the starting magnetic flux density value, this technique can be repeated for different jump sizes. Also, in a manner similar to the procedure outlined above, different end values of the magnetic field/flux density can be obtained.

The system behaviour, and especially the dynamic behaviour, particularly at small magnetic field/flux density/mass values, is dependent upon the position within the magnet 70. This means that, for a wide simultaneous mass range and a low mass, e.g. for determining $He^3$ and $He^4$ simultaneously, the controller settings are dependent upon the mass to charge ratio of the ions, or, more exactly, the position of the detector 120 as well. In such highly specialised cases, it may be preferable to determine the controller settings independently for different collector positions.

Determining the Controller Settings for Both Static and Dynamic Fields.

The controller settings obtained by jumping between two magnetic flux densities can be combined with those obtained (separately) from static field measurements. During a jump between two flux densities, in general terms it is desirable that the final flux density (for measuring ions of the final m/z) should be reached as quickly as possible; therefore the controller settings are optimized with this goal in mind. After the jump, the stability of the magnetic flux density is of utmost importance; therefore after having reached the second magnetic flux density, the controller settings can be switched to use those derived instead from the static calibrations for that particular set of mass spectrometer parameters. In a transition period, a combination of the static and dynamic controller settings may be employed, where the long term drift effects determined by the controller settings during a jump are taken into account, but otherwise the settings obtained by the static calibration are employed.

The various different methods of determining the controller settings, both for static and dynamic magnetic fields, may be carried out automatically, without user interaction. Determination of the settings may be repeated e.g. on a yearly or biennial basis and/or after baking the system. It is also desirable to carry out the controller setting determination when the instrument is parameterized for a high resolving power, in order to obtain maximum precision during ion analysis.

Using Peak Edges for Magnetic Flux Density Control.

Figure 8:
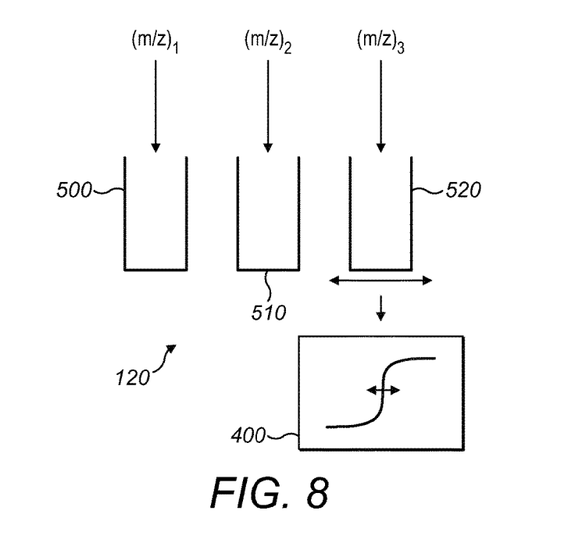
FIG. 8 shows an arrangement of ion detectors suitable for use with the magnetic sector mass spectrometer of FIG. 3.

Turning to FIG. 8, a specific arrangement of ion collectors (eg Faraday cups) forming the ion detector 120 is shown.

Often, not all masses falling into the mass range of the detector 120 are used for measuring isotope ratios. There might be a mass that is not from the analyte gas, e.g. Ar (mass 40) when measuring CO2 (mass 44). Or, alternatively, not all isotopes coming from the analyte gas are of interest for a specific analytical problem. In either case, the ion species that is identified to be present but not of analytical interest can be used as a "sacrificial" mass for collection in a variable multicollector ion detector as shown in FIG. 8.

As seen in that FIG., the ion detector 120 comprises a plurality of spatially separated ion collectors 500, 510, 520. The relative positions of the ion collectors are adjustable: in particular, the third ion collector 520 position may be adjustable alone, and/or two or all three of the collectors may be relatively moveable. Moreover, in one embodiment, the collector positions may be manually adjusted, whereas in other embodiments, the digital controller or another microprocessor may adjust the position of the ion collectors in order to achieve the effect below.

By adjusting one or more of the accelerating potential, the magnetic flux density, and the absolute/relative collector positions, ions of a first mass to charge ratio $(m/z)_1$ are directed towards a first collector 500. Ions of a second mass to charge ratio $(m/z)_2$ are directed towards a second collector 510. Meanwhile, the third collector, 520, can be positioned in such a way that, during analysis of an analyte, the sacrificial mass, whose mass to charge ratio is $(m/z)_3$ is at the peak edge. As explained above, the signal of this third collector 520 thus provides a very precise way to measure changes in the magnetic flux density of the magnet 70. The other masses $(m/z)_1$ and $(m/z)_2$ are analysed via the first and second collectors 500, 510, as usual.

The signal from the third collector 520 may be fed back into the magnet current source 80 (either electronically or by the data logger 400, or via the computer 410—see FIG. 6), in order to stabilize the magnetic flux density further.

There are two cases where this feedback is especially advantageous. The first case is where there is a small shoulder at the edge of the measurement mass. Here, it is mandatory to keep the magnetic flux density as stable as possible: by small changes in the magnetic flux density the shoulder would be left. Stabilizing the flux density by the procedure explained above would increase the accuracy. Because a variation in the flux density of 1 ppm would be equivalent to a variation in the signal intensity of 5% of the peak value, this technique could be used to gain flux density stabilities far into the sub-ppm range.

The second particularly advantageous use of the feedback is when measuring a small intensity with a SEV at the foot of a large peak. Here, it is important that the SEV is protected from the much larger intensity of the neighbouring mass, and this protection can be done using the procedure explained above.

Although FIG. 8 shows two analyte ion collectors, it will be understood of course that other quantities of analyte ion species can be employed (1, 3, 4 . . . ) Moreover there may be circumstances where 2 or more different sacrificial masses are desirable.

The foregoing detailed description has described only a few of the many forms that this invention may take. For this reason the detailed description is intended by way of illustration and not by way of limitation. Various modifications and additions to the specific embodiments that have been described, will be contemplated by the skilled person. For example, although the embodiments above are described in the context of a digital PID controller, it will be understood that various other controllers are contemplated, such as, but not limited to, a state controller with observer; an "interdependent" network control; direct synthesis methods; a minimal prototype algorithm; Dahlin's Algorithm; Vogel-Edgar Algorithm; Internal Model Control; Digital Feedforward control; General linear controller; R(s) U(s)=T(s) Ysp(s)−S(s) Y(s); R, S, T are polynomials of arbitrary order; Discrete-time linear MISO controllers; Model predictive Control; and/or Fuzzy control.

The invention claimed is:

1. A control system for controlling a magnet of a magnetic sector mass spectrometer, comprising:
   a magnetic field sensor for sensing the magnetic field of the magnet and generating an output representative thereof;
   a set point generator configured to generate an output representative of, or related to, a desired magnetic field of the magnet; and
   a digital controller configured to receive a variable digital input signal from the output of the magnetic field sensor and a set point digital input signal from the output of the set point generator, and to generate a digital output from which is derived a control signal for controlling a current to the magnet so as to control, in turn, the magnetic field thereof;

an ion detector for detecting ions passing through the magnetic sector mass spectrometer, the ion detector being configured to generate a detector output signal representative of the quantity of ions incident upon the detector; and a processor, wherein the processor is arranged to receive the detector output signal, and configured to calculate a controller setting based upon the detection of ions at the detector, and wherein the control system is arranged to apply to the digital controller a selected one of a plurality of different controller settings, in accordance with the desired magnetic field of the magnet.

2. The control system of claim 1, wherein the magnetic field sensor further comprises an analogue to digital converter (ADC) so as to convert an analogue signal representative of the magnetic field of the magnet into the said variable digital input signal for the digital controller, at the magnetic field sensor.

3. The control system of claim 2, further comprising a temperature controlling arrangement for controlling the ADC output in accordance with the temperature of the ADC and magnetic field sensor.

4. The control system of claim 3, wherein the temperature controlling arrangement includes a temperature sensor positioned so as to determine the temperature at or adjacent the magnetic field sensor.

5. The control system of claim 4, wherein the temperature sensor has an output that is provided to the ADC, for temperature correction of the magnetic field measured by the magnetic field sensor.

6. The control system of claim 5, wherein the digital controller is furnished with a calibration curve or look up table representative of the response of the magnetic field sensor as a function of the temperature measured by the temperature sensor, the temperature sensor output being supplied as a further input to the digital controller which then adjusts the variable digital input signal derived from the magnetic field sensor in accordance with the temperature sensor output.

7. The control system of claim 4, wherein the temperature controlling arrangement further comprises a temperature controller and a heater/cooler, the temperature sensor providing a measured input to the temperature controller for comparison against a set point temperature input, the temperature controller generating a control signal output to the heater/cooler so as to reduce an error between the set point and measured temperature inputs.

8. The control system of claim 7 further comprising a digital filter arranged to filter the ADC output.

9. The control system of claim 8, wherein the digital filter is an infinite impulse response filter such as a Chebyshev type I filter.

10. The control system of claim 1, wherein the magnetic field sensor is a magneto-resistive sensor formed from a single crystal.

11. The control system of claim 1, further comprising a digital to analogue converter (DAC) arrangement for converting the digital output of the digital controller into an analogue signal.

12. The control system of claim 11, wherein the DAC arrangement forms a part of the digital controller.

13. The control system of claim 11, further comprising an analogue power amplifier between the digital controller and the magnet, for amplifying the output of the DAC arrangement.

14. The control system of claim 13, further comprising an analogue damping circuit arranged between magnet and the analogue power amplifier, the analogue damping circuit having an output which is combined with the output of the DAC to form a first input to the analogue power amplifier.

15. The control system of claim 14, wherein the power amplifier is an operational amplifier, the combination of the analogue damping circuit output and the DAC output being connected to the non inverting input of the operational amplifier.

16. The control system of claim 14, wherein the analogue damping circuit has a switchable frequency response.

17. The control system of claim 11, wherein the DAC arrangement comprises a plurality of DACs.

18. A magnetic sector mass spectrometer comprising:
an ion source arranged to generate a beam of ions having a mass to charge ratio m/z;
an ion accelerator arranged to accelerate ions to a potential $U_o$; and
a magnet under the control of the control system of claim 1, arranged to divert the accelerated ions along a circular path in accordance with m/z, $U_o$, and the magnetic flux density within the magnet.

19. The magnetic sector mass spectrometer of claim 18, further comprising a second ion detector also positioned downstream of the magnet but spatially separated in a transverse direction perpendicular to the direction of travel of the ion beam; wherein the ion beam comprises ions of first and second mass-to-charge ratios, the processor being configured to control the parameters of the mass spectrometer so as to align an edge of a mass spectral peak of ions of the first mass-to-charge ratio with the second ion detector, whilst ions of the second mass to charge ratio are directed toward the first ion detector.

20. A magnetic sector mass spectrometer according to claim 19, wherein
the ion source is arranged to generate a beam of ions containing a plurality of ion species each having a mass to charge ratio $(m/z)_i$;
the ion accelerator is arranged to accelerate the ions in the ion beam to a potential $U_o$;
the magnet is arranged to divert the accelerated ions along a circular path in accordance with $(m/z)_i$, $U_o$ and the magnetic flux density B within the magnet;
the ion source is arranged to generate ions of a first sacrificial on species having a mass to charge ratio $(m/z)_1$ which follow a first curved path within the magnet, and to generate ions of a second, analyte ion species different to the sacrificial species having a mass to charge ratio $(m/z)_2$ which follow a second curved path, different to the first curved path, within the magnet, and further wherein the ion detection arrangement has a plurality of spatially separated detectors;
the control system being configured to adjust one or more of the flux density B, the acceleration potential $U_0$ and/or the position of a detector or detectors in the ion detection arrangement, so that ions of the sacrificial species are directed toward a first detector in order that the edge of a mass peak representative of those ions of the sacrificial species is aligned with the first detector, whilst ions of the analyte ion species are directed toward a second detector, spatially separated from the first detector, so that a mass Peak representative of those analyte ions is generally aligned with the second detector away from the mass peak edges;

and further wherein the magnetic field sensor includes the first detector, the first detector having an output signal representing intensity at the peak edge of the sacrificial mass, from which the said variable digital input signal for the controller is generated.

21. The control system of claim 1, wherein the control system is configured to control the parameters of the mass spectrometer, so as to align an edge of a mass spectral peak of an ion species with the ion detector, and to determine, by perturbing the mass spectrometer parameters when the peak edge is aligned with the ion detector, controller settings suitable for the particular magnetic flux density of the magnet generated in accordance with the corresponding magnet current control signal.

22. A method of determining controller settings for a controller, wherein the controller controls a magnetic field generated by a magnet in a magnetic sector mass spectrometer, the method comprising the steps of:

generating ions having a mass to charge ratio m/z;

accelerating the ions of mass to charge ratio m/z;

generating a magnetic field, having a magnetic flux density Bm, in the magnet;

directing ions of mass to charge ratio m/z into the magnet, where they follow a curved path towards an ion detector;

adjusting the parameters of the magnetic sector mass spectrometer so as to cause an edge of a mass peak corresponding with the ions of mass to charge ratio m/z to align with the detector;

perturbing the parameters of the magnetic sector mass spectrometer once the edge of the mass peak has been aligned with the detector;

deriving, from the applied perturbation, a first static field controller setting for the system controller for application to the system controller for the magnetic flux density Bm; and applying that derived first static field controller setting to the system controller for subsequent detection of ions at that magnetic field Bm.

\* \* \* \* \*

UNITED STATES PATENT AND TRADEMARK OFFICE
CERTIFICATE OF CORRECTION

PATENT NO. : 10,176,978 B2
APPLICATION NO. : 15/532935
DATED : January 8, 2019
INVENTOR(S) : Juergen Jaeschke et al.

It is certified that error appears in the above-identified patent and that said Letters Patent is hereby corrected as shown below:

In the Claims

Claim 20, Column 18, Line 51:
Replace "sacrificial on species"
With --sacrificial ion species--

Claim 20, Column 18, Line 67-Column 19, Line 1:
Replace "so that a mass Peak representative of those analyte ions"
With --so that a mass peak representative of those analyte ions--

Signed and Sealed this
Twenty-seventh Day of August, 2019

Andrei Iancu
*Director of the United States Patent and Trademark Office*